(12) United States Patent
Zou et al.

(10) Patent No.: US 12,219,886 B2
(45) Date of Patent: Feb. 4, 2025

(54) RESISTIVE MEMORY DEVICE

(71) Applicant: United Semiconductor (Xiamen) Co., Ltd., Fujian (CN)

(72) Inventors: Shuzhi Zou, Fujian (CN); Dejin Kong, Fujian (CN); Xiang Bo Kong, Fujian (CN); Chin-Chun Huang, Hsinchu County (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 860 days.

(21) Appl. No.: 17/388,027

(22) Filed: Jul. 29, 2021

(65) Prior Publication Data

US 2022/0416159 A1    Dec. 29, 2022

(30) Foreign Application Priority Data

Jun. 24, 2021   (CN) .......................... 202110702841.7

(51) Int. Cl.
*H10N 70/20*    (2023.01)
*H10N 70/00*    (2023.01)

(52) U.S. Cl.
CPC ................................ *H10N 70/841* (2023.02)

(58) Field of Classification Search
CPC .......................... H10N 70/826; H10N 70/841
See application file for complete search history.

(56) References Cited

U.S. PATENT DOCUMENTS

| 7,033,940 | B1 | 4/2006 | Marathe |
| 11,101,324 | B2 * | 8/2021 | Lin ...................... H10K 19/202 |
| 12,089,512 | B2 * | 9/2024 | Su ......................... H10N 70/028 |
| 2004/0048468 | A1 | 3/2004 | Liu |

FOREIGN PATENT DOCUMENTS

| CN | 104659050 A | 5/2015 |
| CN | 112086556 A | 12/2020 |

* cited by examiner

*Primary Examiner* — Mark V Prenty
(74) *Attorney, Agent, or Firm* — Winston Hsu

(57) ABSTRACT

A resistive memory device includes a stacked structure and a copper via conductor structure. The stacked structure includes a first electrode, a second electrode, and a variable resistance layer. The second electrode is disposed above the first electrode in a vertical direction, and the variable resistance layer is disposed between the first electrode and the second electrode in the vertical direction. The copper via conductor structure is disposed under the stacked structure. The first electrode includes a tantalum nitride layer directly connected with the copper via conductor structure.

13 Claims, 4 Drawing Sheets

RESISTIVE MEMORY DEVICE

BACKGROUND OF THE INVENTION

1. Field of the Invention

The present invention relates to a resistive memory device, and more particularly, to a resistive memory device including a copper via conductor structure.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. Resistive random access memory (RRAM) is a kind of non-volatile memory technology having the characteristics of low operating voltage, low power consumption, and high writing speed and is regarded as a memory structure that can be applied to many electronic devices.

SUMMARY OF THE INVENTION

A resistive memory device is provided in the present invention. A copper via conductor structure is used to improve the quality of the via conductor and/or related manufacturing problems. A first electrode in a stacked structure includes a tantalum nitride layer directly connected with the copper via conductor structure for improving negative influence generated by using the copper via conductor structure.

According to an embodiment of the present invention, a resistive memory device is provided. The resistive memory device includes a stacked structure and a copper via conductor structure. The stacked structure includes a first electrode, a second electrode, and a variable resistance layer. The second electrode is disposed above the first electrode in a vertical direction, and the variable resistance layer is disposed between the first electrode and the second electrode in the vertical direction. The copper via conductor structure is disposed under the stacked structure. The first electrode includes a tantalum nitride layer, and the tantalum nitride layer is directly connected with the copper via conductor structure.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
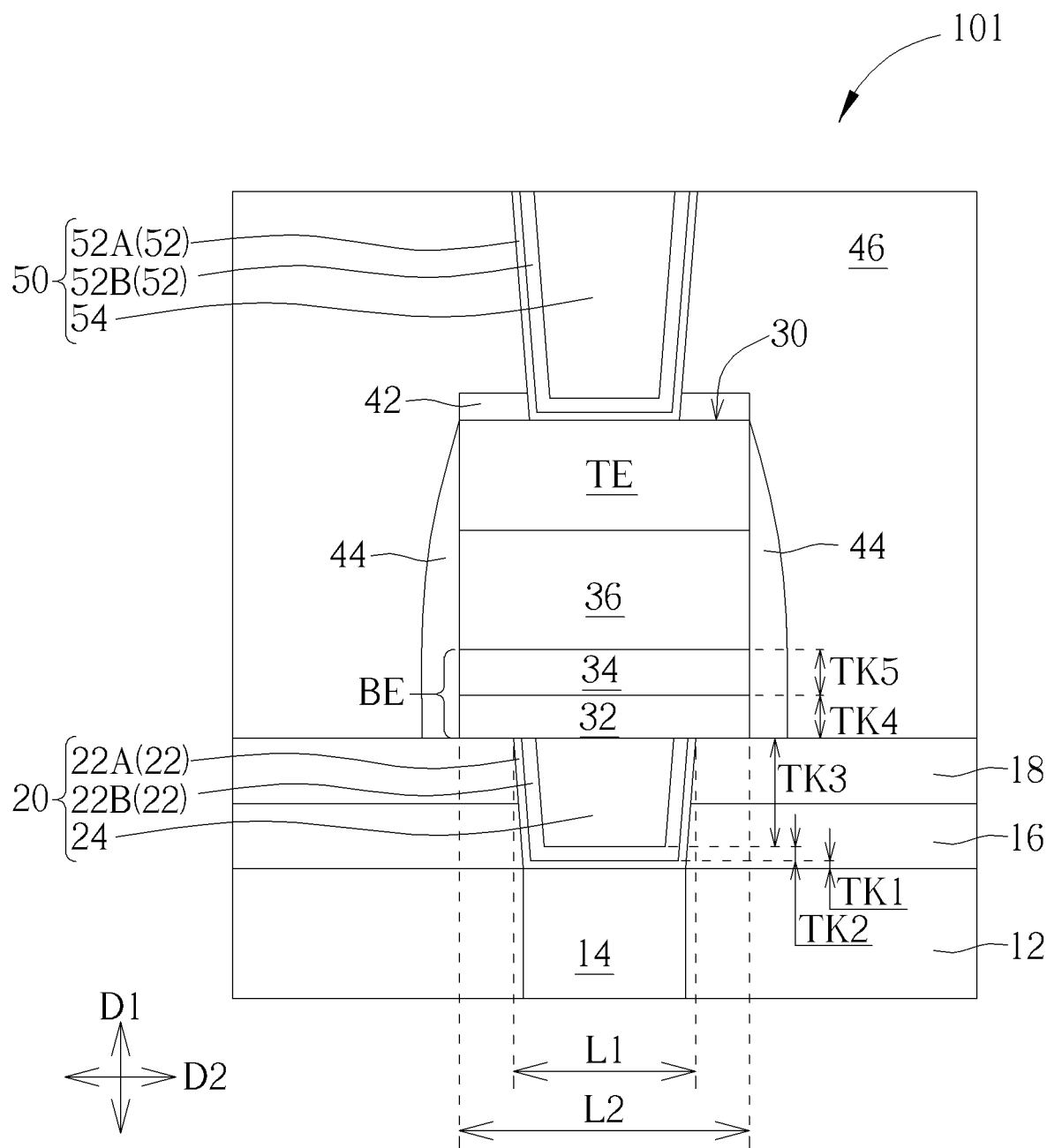
FIG. 1 is a schematic drawing illustrating a resistive memory device according to a first embodiment of the present invention.

Please refer to FIG. 1. FIG. 1 is a schematic drawing illustrating a resistive memory device 101 according to a first embodiment of the present invention. As shown in FIG. 1, the resistive memory device 101 includes a stacked structure 30 and a copper via conductor structure 20. The stacked structure 30 includes a first electrode BE, a second electrode TE, and a variable resistance layer 36. The second electrode TE is disposed above the first electrode BE in a vertical direction (such as a first direction D1 shown in FIG. 1), and the variable resistance layer 36 is disposed between the first electrode BE and the second electrode TE in the first direction D1. The copper via conductor structure 20 is disposed under the stacked structure 30. The first electrode BE includes a tantalum nitride layer 32, and the tantalum nitride layer 32 is directly connected with the copper via conductor structure 20. The copper via conductor structure 20 may be used to improve the quality of the via conductor (such as reducing electrical resistance) and/or related manufacturing issues (such as improving gap-filling performance and reducing air voids generated in the via conductor). The first electrode BE in the stacked structure 30 includes the tantalum nitride layer 32 directly connected with the copper via conductor structure 20 and may be used to improve negative influence generated by using the copper via conductor structure 20, such as enhancing the ability of the first electrode BE to block copper in the copper via conductor structure 20 from entering the variable resistance layer 36 and avoiding the material quality of the variable resistance layer 36 from being influenced by copper diffusion and memory device operation problems generated accordingly (such as that the resistance change status cannot meet the design value, and so forth).

In some embodiments, the stacked structure 30 may be regarded as a resistive memory unit including the variable resistance layer 36, and the variable resistance layer 36 may be regarded as a switching medium in the resistive memory unit. The resistance of the resistive memory unit may be changed by applying suitable voltage to the top electrode and the bottom electrode (such as the second electrode TE and the first electrode BE) in the stacked structure 30, and the resistive memory unit may switch to high resistance state (HRS) or low resistance state (LRS) for realizing the operation mode of the memory device, such as storing data, reading data, and resetting.

In some embodiments, the resistive memory device 101 may further include an interlayer dielectric layer 12, a metal line 14, a dielectric layer 16, and a dielectric layer 18. The metal line 14 may be disposed in the interlayer dielectric layer 12. The dielectric layer 16 may be disposed on the interlayer dielectric layer 12 and the metal line 14 in the first direction D1, the dielectric layer 18 may be disposed on the dielectric layer 16 in the first direction D1, and the stacked structure 30 may be disposed on the dielectric layer 18 in the first direction D1. In some embodiments, the metal line 14 may be regarded as a trench conductor mainly elongated in a horizontal direction (such as a horizontal direction orthogonal to the first direction D1 and a second direction D2 shown in FIG. 1), and the copper via conductor structure 20 may be mainly elongated in the first direction D1 and penetrate through the dielectric layer 18 and the dielectric layer 16 located above the metal line 14 for contacting and being electrically connected with the metal line 14.

In some embodiments, the copper via conductor structure 20 may include a first barrier layer 22 and a first copper layer 24, and the first copper layer 24 may be disposed on the first barrier layer 22. In some embodiments, a contact hole penetrating through the dielectric layer 18 and the dielectric layer 16 may be formed first, and the first barrier layer 22 and the first copper layer 24 may be formed sequentially. The contact hole may be filled with the first barrier layer 22 and the first copper layer 24, and the first barrier layer 22 and the first copper layer 24 may be partially formed on a region outside the contact hole. Subsequently, a planarization process (such as a chemical mechanical polishing process, CMP) may be carried out to remove the first barrier layer 22 and the first copper layer 24 located outside the contact hole and form the copper via conductor structure 20. Therefore, the first barrier layer 22 may have a U-shaped structure in a cross-sectional diagram of the copper via conductor structure 20, but not limited thereto.

Compared with a via conductor structure formed with other electrically conductive materials (such as tungsten), the first copper layer 24 in the copper via conductor structure 20 may have better gap-filling performance, and the gap-filling result may be improved for reducing air voids generated in the via conductor structure accordingly. However, for avoiding copper in the first copper layer 24 from diffusing outwards to other material layers and the related negative influence, the first copper layer 24 may be completely encompassed by the first barrier layer 22 and the tantalum nitride layer 32 in the first electrode BE for avoiding and/or reducing the copper diffusion. Therefore, in some embodiments, a length (such as a length L2 shown in FIG. 1) of the tantalum nitride layer 32 of the first electrode BE in a horizontal direction (such as the second direction D2, but not limited thereto) may be greater than a length (such as a length L1 shown in FIG. 1) of the copper via conductor structure 20 in this horizontal direction for reducing the chance that the first copper layer 24 in the copper via conductor structure 20 is not completely covered by the tantalum nitride layer 32 of the first electrode BE in the first direction D1 because of manufacturing process variations (such as alignment shift), but not limited thereto.

Additionally, a material composition of the first barrier layer 22 may be identical to a material composition of the tantalum nitride layer 32 in the first electrode BE (such as being tantalum nitride both) or not. In some embodiments, the first barrier layer 22 may include a first layer 22A and a second layer 22B, the second layer 22B may be disposed on the first layer 22A, and a material composition of the second layer 22B may be different from a material composition of the first layer 22A. For example, the first layer 22A may be a material having barrier performance better than that of the material of the second layer 22B and electrical conductivity lower than that of the material of the second layer 22B, the second layer 22B may be a material having barrier performance worse than that of the material of the first layer 22A and electrical conductivity higher than that of the material of the first layer 22A, and the electrical conductivity of the second layer 22B may be higher than the electrical conductivity of the first layer 22A accordingly, but not limited thereto. In some embodiments, the first layer 22A may be a tantalum nitride layer and the second layer 22B may be a tantalum layer, and the material composition of the first layer 22A may be identical to the material composition of the tantalum nitride layer 32 in the first electrode BE accordingly. Additionally, in the condition described above, a thickness TK2 of the second layer 22B may be greater than a thickness TK1 of the first layer 22A, and a thickness TK3 of the first copper layer 24 may be greater than the thickness TK2 of the second layer 22B for reducing the overall electrical resistance of the copper via conductor structure 20 while maintaining the required barrier performance. For example, the thickness TK1 of the first layer 22A may be about 16 angstroms, the thickness TK2 of the second layer 22B may be about 60 angstroms, and the thickness TK3 of the first copper layer 24 may be about 300 angstroms, but not limited thereto. In addition, the first copper layer 24 may be completely encompassed by the first barrier layer 22 and the tantalum nitride layer 32 in the first electrode BE, and the first layer 22A and the second layer 22B in the first barrier layer 22 may be directly connected with the tantalum nitride layer 32 in the first electrode BE accordingly.

In some embodiments, the first electrode BE may further include an electrically conductive layer 34 disposed between the tantalum nitride layer 32 and the variable resistance layer 36 in the first direction D1, and a material composition of the electrically conductive layer 34 may be different from the material composition of the tantalum nitride layer 32. In some embodiments, the variable resistance layer 36 may include metal oxide such as transition metal oxide, perovskite oxide, or other suitable variable resistance materials. The second electrode TE and the electrically conductive layer 34 may respectively include aluminum, platinum, ruthenium, iridium, nickel, cobalt, chromium, tungsten, copper, hafnium, zirconium, zinc, gold, titanium, an alloy of the material described above, a mixture of the material described above, or other suitable metallic electrically conductive materials or non-metallic electrically conductive materials. In some embodiments, the material composition of the electrically conductive layer 34 may be identical to a material composition of the second electrode TE, such as both being a material having better contact condition between the variable resistance layer 36 and this material (such as lower contact resistance). For example, both the second electrode TE and the electrically conductive layer 34 may be titanium nitride, but not limited thereto. In some embodiments, the tantalum nitride layer 32 in the first electrode BE may be a material having better barrier performance for copper, and the electrically conductive layer 34 in the first electrode BE may be a material having better contact condition between the variable resistance layer 36 and this material and/or relatively higher electrical conductivity. A thickness TK4 of the tantalum nitride layer 32 in the first electrode BE and a thickness TK5 of the electrically conductive layer 34 in the first electrode BE may be modified and adjusted for different product specifications, and the thickness TK4 of the tantalum nitride layer 32 may be substantially equal to or different from the thickness TK5 of the electrically conductive layer 34. For example, the thickness TK4 of the tantalum nitride layer 32 and the thickness TK5 of the electrically conductive layer 34 may be about 150 angstroms respectively, but not limited thereto.

In some embodiments, the resistive memory device 101 may further include a mask layer 42, a spacer 44, an interlayer dielectric layer 46, and a metal line 50. The mask layer 42 may be disposed on the stacked structure 30 in the first direction D1, the spacer 44 may be disposed on the sidewall of the stacked structure 30, and the interlayer dielectric layer 46 may be disposed on the dielectric layer 18 and cover the stacked structure 30, the mask layer 42, and the spacer 44. The metal line 50 may be disposed on the stacked structure 30 in the first direction D1 and electrically connected with the second electrode TE. In some embodiments, the metal line 50 may be regarded as a trench conductor mainly elongated in a horizontal direction, and the metal line 50 may penetrate through the interlayer dielectric layer 46 and the mask layer 42 for contacting and being electrically connected with the second electrode TE in the stacked structure 30. Additionally, in some embodiments, the metal line 50 may include a second barrier layer 52 and a second copper layer 54, and the second copper layer 54 may be disposed on the second barrier layer 52. The metal line 50 may be regarded as a copper trench conductor structure, a material composition of the second copper layer 52 may be identical to a material composition of the first copper layer 22, and a material composition of the second barrier layer 52 may be identical to the material composition of the first barrier layer 22, but not limited thereto.

In some embodiments, the second barrier layer 52 may include a first layer 52A and a second layer 52B. The second layer 52B may be disposed on the first layer 52A, and a material composition of the second layer 52B may be different from a material composition of the first layer 52A. For example, the first layer 52A may be a material having barrier performance better than that of the material of the second layer 52B and electrical conductivity lower than that of the material of the second layer 52B, and the second layer 52B may be a material having barrier performance worse than that of the material of the first layer 52A and electrical conductivity higher than that of the material of the first layer 52A, but not limited thereto. In some embodiments, the first layer 52A may be a tantalum nitride layer, and the second layer 52B may be a tantalum layer. A thickness of the second layer 52B may be greater than a thickness of the first layer 52A, and a thickness of the second copper layer 54 may be greater than the thickness of the second layer 52B for reducing the overall electrical resistance of the metal line 50 while maintaining the required barrier performance. In other words, the material composition and the structural design of the metal line 50 may be similar to those of the copper via conductor structure 20, but not limited thereto.

In some embodiments, the interlayer dielectric layer 12 and the interlayer dielectric layer 46 may include an ultra low dielectric constant (ULK) dielectric material (such as a dielectric material with a dielectric constant lower than 2.7), such as benzocyclclobutene (BCB), hydrogen silsesquioxane (HSQ), methyl silesquioxane (MSQ), hydrogenated silicon oxycarbide (SiOC—H), a porous dielectric material, or other suitable dielectric materials. The metal line 14 may include a low electrical resistivity material and a barrier layer, the low electrical resistivity layer may include a material having a relatively lower electrical resistivity, such as copper, aluminum, tungsten, and so forth, and the barrier layer may include titanium nitride, tantalum nitride, or other suitable electrically conductive materials, but not limited thereto. In some embodiments, the dielectric layer 16 may be used as an etching stop layer, and the material of the dielectric layer 16 may include e nitrogen doped carbide (NDC), silicon nitride, silicon carbon-nitride (SiCN), or other suitable dielectric materials. The mask layer 42 and the spacer 44 may respectively include a single layer or multiple layers of dielectric materials, such as silicon nitride, silicon carbonitride, or other suitable dielectric materials.

In some embodiments, the interlayer dielectric layer 12 may be disposed on a substrate (not illustrated), and the substrate may include a semiconductor substrate, such as a silicon substrate, a silicon germanium semiconductor substrate, a silicon-on-insulator (SOI) substrate, or a substrate made of other suitable materials, but not limited thereto. In addition, before the step of forming the interlayer dielectric layer 12, a device (such as a transistor) and/or circuits (not illustrated) may be formed on the substrate described above, and the metal line 14 may be electrically connected downward to the device and/or the circuits on the substrate, but not limited thereto. In some embodiments, the manufacturing method of the resistive memory device 101 may be integrated with the back end of line (BEOL) process in the semiconductor manufacturing process, the interlayer dielectric layer 12, the dielectric layer 16, the dielectric layer 18, and the interlayer dielectric layer 46 may be regarded as an interlayer dielectric layer formed in the BEOL process, and the metal line 14, the copper via conductor structure 20, and the metal line 50 may be regarded as a part of an interconnection structure formed in the BEOL process, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
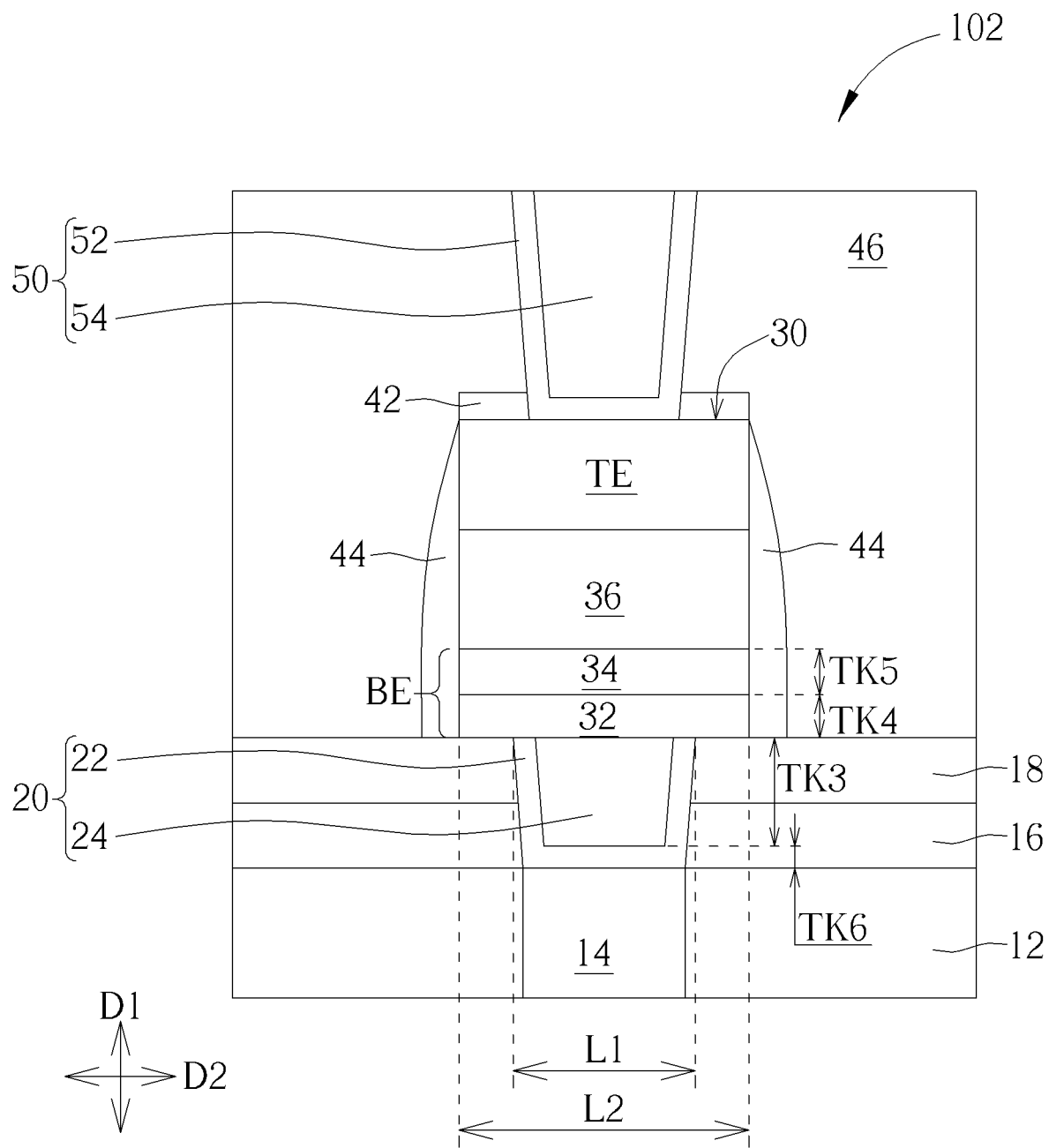
FIG. 2 is a schematic drawing illustrating a resistive memory device according to a second embodiment of the present invention.

Please refer to FIG. 2. FIG. 2 is a schematic drawing illustrating a resistive memory device 102 according to a second embodiment of the present invention. As shown in FIG. 2, in some embodiments, the first barrier layer 22 in the copper via conductor structure 20 may be formed with a single material, such as tantalum nitride, tantalum, or other suitable barrier materials, and a thickness TK6 of the first barrier layer 22 may be less than the thickness TK3 of the first copper layer 22. Additionally, in some embodiments, the second barrier layer 52 in the metal line 50 may also be formed with a single material, such as tantalum nitride, tantalum, or other suitable barrier materials, and the material composition of the second barrier layer 52 may be identical to the material composition of the first barrier layer 22 for simplifying the related manufacturing method, but not limited thereto.

Figure 3:
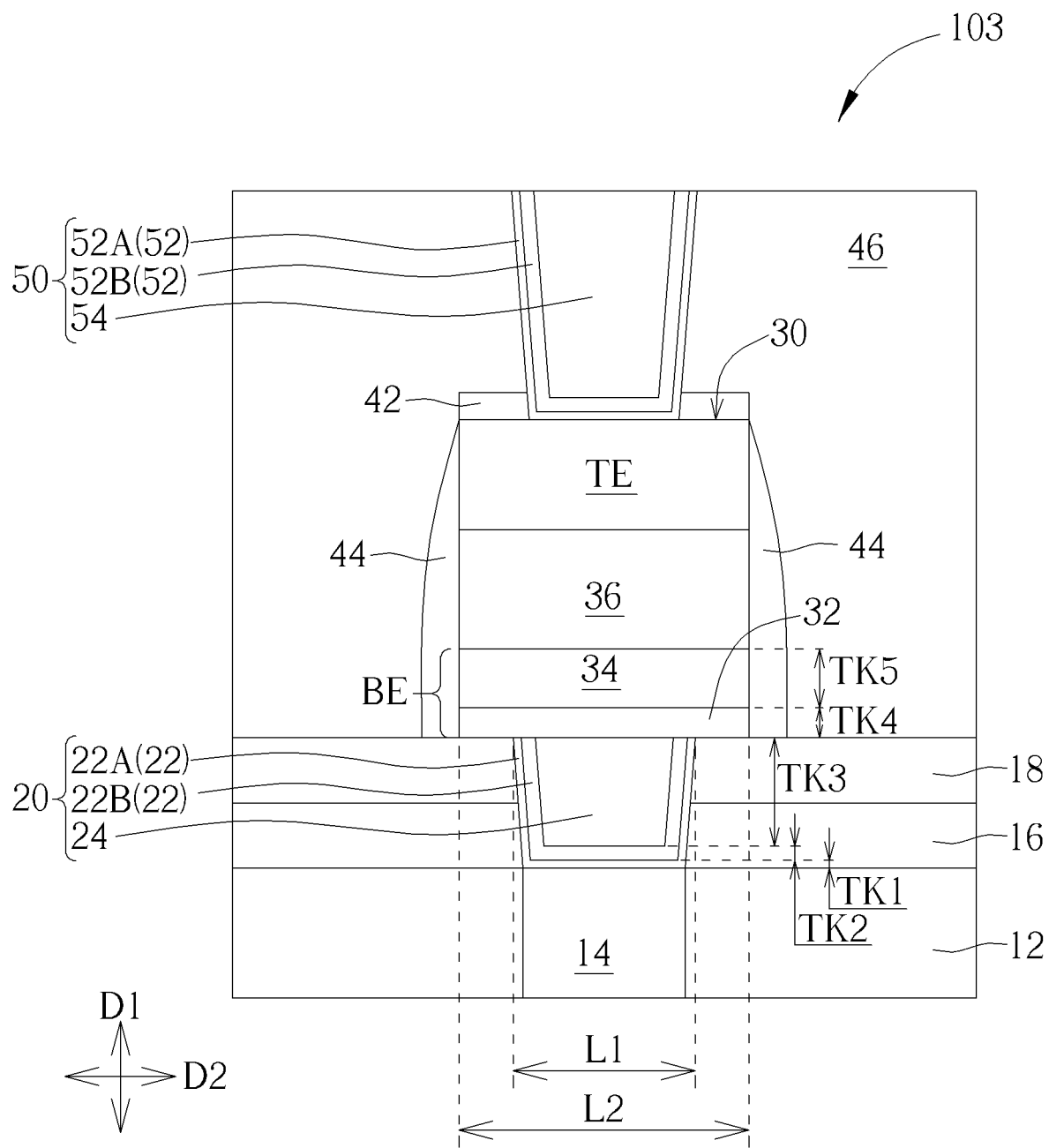
FIG. 3 is a schematic drawing illustrating a resistive memory device according to a third embodiment of the present invention.

Please refer to FIG. 3. FIG. 3 is a schematic drawing illustrating a resistive memory device 103 according to a third embodiment of the present invention. As shown in FIG. 3, in some embodiments, the thickness TK5 of the electrically conductive layer 34 may be greater than the thickness TK4 of the tantalum nitride layer 32. For example, when the electrical conductivity of the electrically conductive layer 34 in the first electrode BE is obviously higher than that of the tantalum nitride layer 32, the overall electrical resistance of the first electrode BE may be reduced by making the thickness TK5 of the electrically conductive layer 34 greater than the thickness TK4 of the tantalum nitride layer 32, and the operation performance of the resistive memory unit may be improved accordingly, but not limited thereto.

Figure 4:
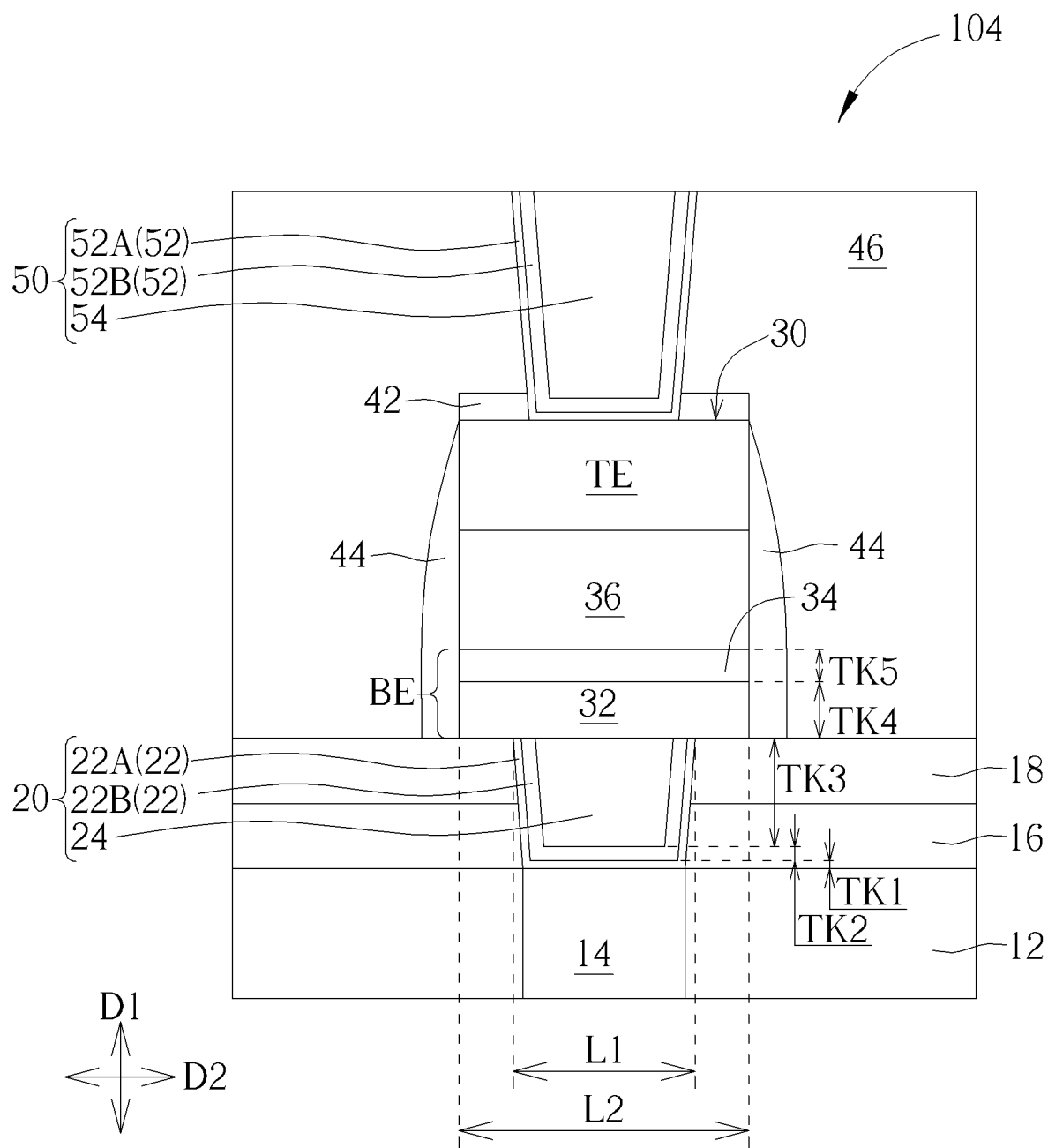
FIG. 4 is a schematic drawing illustrating a resistive memory device according to a fourth embodiment of the present invention.

Please refer to FIG. 4. FIG. 4 is a schematic drawing illustrating a resistive memory device 104 according to a fourth embodiment of the present invention. As shown in FIG. 4, in some embodiments, the thickness TK4 of the tantalum nitride layer 32 may be greater than the thickness TK5 of the electrically conductive layer 34. For example, in some embodiments, when the material quality of the variable resistance layer 36 tends to be influenced by copper diffusion, the thickness TK4 of the tantalum nitride layer 32 may be increased relatively for improving the performance of blocking copper in the copper via conductor structure 20 from diffusing to the variable resistance layer 36, and the thickness TK4 may be greater than the thickness of the first barrier layer 22 accordingly, but not limited thereto.

To summarize the above descriptions, in the resistive memory device according to the present invention, the copper via conductor structure may be used to improve the quality of the via conductor and/or the related manufacturing issues. The first electrode in the stacked structure includes the tantalum nitride layer directly connected with the copper via conductor structure for improving the performance of blocking copper in the copper via conductor structure from diffusing to the variable resistance layer, and the manufacturing yield and/or the operation performance of the resistive memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive memory device, comprising:
   a stacked structure, the stacked structure comprising:
      a first electrode;
      a second electrode disposed above the first electrode in a vertical direction; and
      a variable resistance layer disposed between the first electrode and the second electrode in the vertical direction; and
   a copper via conductor structure disposed under the stacked structure, wherein the first electrode comprises a tantalum nitride layer and an electrically conductive layer disposed between the tantalum nitride layer and the variable resistance layer, the tantalum nitride layer is directly connected with the copper via conductor structure, and a material composition of the electrically conductive layer is different from a material composition of the tantalum nitride layer.

2. The resistive memory device according to claim 1, wherein the copper via conductor structure comprises:
   a first barrier layer; and
   a first copper layer disposed on the first barrier layer.

3. The resistive memory device according to claim 2, wherein a material composition of the first barrier layer is identical to a material composition of the tantalum nitride layer in the first electrode.

4. The resistive memory device according to claim 2, wherein the first copper layer is completely encompassed by the first barrier layer and the tantalum nitride layer in the first electrode.

5. The resistive memory device according to claim 2, wherein the first barrier layer comprises:
   a first layer; and
   a second layer disposed on the first layer, wherein a material composition of the second layer is different from a material composition of the first layer.

6. The resistive memory device according to claim 5, wherein electrical conductivity of the second layer is higher than electrical conductivity of the first layer.

7. The resistive memory device according to claim 5, wherein a thickness of the second layer is greater than a thickness of the first layer.

8. The resistive memory device according to claim 5, wherein the first layer is a tantalum nitride layer and the second layer is a tantalum layer.

9. The resistive memory device according to claim 2, further comprising:
   a metal line disposed on the stacked structure and electrically connected with the second electrode, wherein the metal line comprises:
      a second barrier layer; and
      a second copper layer disposed on the second barrier layer.

10. The resistive memory device according to claim 9, wherein a material composition of the second barrier layer is identical to a material composition of the first barrier layer.

11. The resistive memory device according to claim 1, wherein the material composition of the electrically conductive layer is identical to a material composition of the second electrode.

12. The resistive memory device according to claim 1, wherein a thickness of the electrically conductive layer is greater than a thickness of the tantalum nitride layer.

13. The resistive memory device according to claim 1, wherein a thickness of the tantalum nitride layer is greater than a thickness of the electrically conductive layer.

* * * * *